United States Patent
Iwabuki et al.

(10) Patent No.: US 7,224,150 B2
(45) Date of Patent: May 29, 2007

(54) REDUNDANCY CIRCUIT FOR SERIES-CONNECTED DIODES

(75) Inventors: Hiroyasu Iwabuki, Tokyo (JP); Akihiko Iwata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 313 days.

(21) Appl. No.: 11/066,275

(22) Filed: Feb. 28, 2005

(65) Prior Publication Data

US 2005/0140345 A1   Jun. 30, 2005

(51) Int. Cl.
*G05F 3/16* (2006.01)
*G05F 1/613* (2006.01)
*H05B 37/00* (2006.01)
*H02H 7/10* (2006.01)

(52) U.S. Cl. .................... 323/225; 323/223; 315/122

(58) Field of Classification Search ............... 323/220, 323/223, 225, 226, 229–231, 233, 265, 268–273; 315/119–127, 161, 167, 185 R, 201, 207, 315/210, 312, 320

See application file for complete search history.

(56) References Cited

U.S. PATENT DOCUMENTS

| | | | | |
|---|---|---|---|---|
| 4,556,773 A | * | 12/1985 | Yoshiyuki et al. | ........... 219/723 |
| 4,725,916 A | * | 2/1988 | Oshikiri | ....................... 361/104 |
| 5,459,328 A | | 10/1995 | Kadota et al. | |
| 6,137,816 A | | 10/2000 | Kinbara | |
| 6,184,662 B1 | * | 2/2001 | Yabuuchi et al. | ............ 323/222 |
| 6,847,175 B2 | * | 1/2005 | Nerone | ........................ 315/224 |

FOREIGN PATENT DOCUMENTS

| | | |
|---|---|---|
| JP | 59-103565 | 6/1984 |
| JP | 2-244685 | 9/1990 |
| JP | 6-338647 | 12/1994 |
| JP | 11-87818 | 3/1999 |
| JP | 2002-25784 | 1/2002 |

* cited by examiner

*Primary Examiner*—Matthew V. Nguyen
(74) *Attorney, Agent, or Firm*—Oblon, Spivak, McClelland, Maier & Neustadt, P.C.

(57) ABSTRACT

A redundancy circuit for a diode circuit composed of a plurality of diodes connected in series, according to the present invention, includes: bypass circuits, each of which is connected in parallel to each group, the diode circuit being divided into a plurality of group, each group having one or more diodes connected in series, and each bypass circuit including a first voltage-controlled switching device connected in parallel to the corresponding group, and a detection circuit which has a constant voltage device and a fusing circuit, both of which are connected in series, the detection circuit being connected in parallel to the corresponding group; and when, because of increased resistance of any diode, a voltage applied to one of the groups exceeds a given voltage defined by the constant voltage device, the voltage-controlled switching device is turned on so as to bypass a current that is to pass through the corresponding group, whereby continuing the operation of the whole apparatus even when one or more diodes are broken down.

9 Claims, 7 Drawing Sheets

REDUNDANCY CIRCUIT FOR SERIES-CONNECTED DIODES

BACKGROUND OF THE INVENTION

1. Field of the Invention

The present invention relates to a redundancy circuit for series-connected diodes, which can be functionally substituted for a broken diode in a circuit composed of a plurality of diodes connected in series.

2. Description of the Related Art

A number of diodes, such as light emitting diode, are arranged in array for usage of a display. There is a possibility that part of these diodes are broken during use. A conventional art for coping with breakage of a diode, e.g., Japanese Patent Unexamined Publication (kokai) JP-A-2-244685 (1990), discloses a protection circuit for a laser diode, which is designed to detect the temperature of the laser diode. When the detected temperature is in a given range of temperature, the laser diode is supplied with a current based on a diode driving signal. If the detected temperature exceeds a maximum temperature, the current is shut down by the driving signal.

The protection circuit described above is a circuit for preventing a diode from breaking due to rise of temperature. Several other protection circuits for protecting a diode from a surge, over current or abnormal temperature are proposed. Since these circuits aim at preventing failure, once a diode is broken, an interlocking circuit will halt the whole apparatus.

An apparatus, which is configured of a number of diodes connected in series, has an advantage of easy wiring of the diodes. However, if one or more diodes among them are broken down without any conduction so as to open the circuit, no current can pass through the whole series-connected diodes, resulting in malfunction of the apparatus. Meanwhile, even under a condition of partial damage of the diodes, there are needs for continuous operation of the apparatus using the remaining diodes. In particular, a light-emitting panel or a display panel, in which a number of light emitting diodes are connected in series and arranged in array, could not lose the function even though a few diodes are broken down.

In another case one or more diodes among the array of diodes are broken down into an internal short-circuit, reduction of resistance may cause the broken diode to heat up, thereby causing damage to the neighboring diodes. In this case there are also needs for continuous operation of the whole apparatus by shutting off the diode being short-circuited.

SUMMARY OF THE INVENTION

It is an object of the present invention to provide a redundancy circuit for series-connected diodes, which can maintain a current flow in the whole circuit to continue the operation of the whole apparatus even when one or more diodes among them are broken down into an open-circuit or short-circuit.

A redundancy circuit for a diode circuit composed of a plurality of diodes connected in series, according to the present invention, includes:

bypass circuits, each of which is connected in parallel to each group, the diode circuit being divided into a plurality of group, each group having one or more diodes connected in series, each bypass circuit including a first voltage-controlled switching device connected in parallel to the corresponding group, and a detection circuit which has a constant voltage device and a fusing circuit, both of which are connected in series, the detection circuit being connected in parallel to the corresponding group;

wherein the interconnection between the constant voltage device and the fusing circuit is connected to a control terminal of the voltage-controlled switching device, and when, because of increased resistance of any diode, a voltage applied to one of the groups exceeds a given voltage defined by the constant voltage device, the voltage-controlled switching device is turned on by the control terminal so as to bypass a current that is to pass through the corresponding group.

It is preferable that the first voltage-controlled switching device is a field effect transistor, the control terminal of which is the gate thereof, to which a voltage is applied from a separate power source.

It is preferable that each of the bypass circuit further includes a second voltage-controlled switching device connected in parallel to the fusing circuit via a power source, and a control terminal of the second voltage-controlled switching device is connected to the interconnection between the detection circuit and the corresponding group, and when resistance of any diode is decreased, the second voltage-controlled switching device is turned on by the control terminal so as to blow the fusing circuit, so that the first voltage-controlled switching device bypasses a current that is to pass through the corresponding group.

It is preferable that the fusing circuit is composed of a fuse and an overcurrent protect resistor, both of which are connected in series to each other.

It is preferable that in each bypass circuit the primary circuit of a rely is connected between the separate power source and the control terminal of the voltage-controlled switching device, and the secondary circuit of the relay is connected to an indicator device, which is turned on when the fusing circuit is blown.

It is preferable that in each bypass circuit a light emitting device is connected in parallel to the fusing circuit so as to operate when the fusing circuit is blown.

It is preferable that in each bypass circuit the primary circuit of a rely is connected to the fusing circuit, and the secondary circuit of the relay is connected to an indicator device, which is turned on when the fusing circuit is blown.

It is preferable that the relay is a photo-coupler.

In the redundancy circuit according to the present invention, when the internal resistance of any diode is increased by open breakage, the fusing circuit is blown to be cut off, and then the first voltage-controlled switching device is turned on so that the respective bypass circuit bypasses a current that is to pass through the corresponding group. The remaining diodes can be supplied with the bypass current to continue the whole operation.

Further, when the internal resistance of any diode is decreased by the internal short-circuit of the diode with a voltage drop, the second voltage-controlled switching device blows the fusing circuit. In a similar way, the remaining diodes can be supplied with the bypass current to continue the whole operation, thereby preventing the short-circuited diode from heating up to protect the neighboring diodes from the damage.

DETAILED DESCRIPTION OF THE PREFERRED EMBODIMENTS

This application is based on an application No. 2003-363040 filed on Oct. 23, 2003 in Japan, the disclosure of which is incorporated herein by reference.

Hereinafter, preferred embodiments will be described with reference to drawings.

A redundancy circuit according to the present invention is applied to a diode circuit which is composed of a plurality or a number of diodes connected in series. Such a diode circuit can be used, for example, in a display in which a number of light emitting diodes or laser diodes are arranged in array.

The diode circuit can be divided into a plurality of group, each group having one or more diodes connected in series. The redundancy circuit includes bypass circuits, each of which is connected in parallel to each group. Each bypass circuit may be connected to each diode. One group may have two or more diodes. Any group configuration may be employed under such a condition that, if all the diodes residing in one group malfunction by breakage of a single diode among them, other diodes residing the remaining group can continuously maintain the operation of the whole circuit. In this case, it is advantageous that the number of the bypass circuits is reduced in relation to the number of the diodes.

First, in a redundancy circuit for open breakage of diodes connected in series, each bypass circuit includes a first voltage-controlled switching device connected in parallel to the corresponding group, and a detection circuit having a constant voltage device and a fusing circuit, both of which are connected in series, the detection circuit being connected in parallel to the corresponding group. The interconnection between the constant voltage device and the fusing circuit is connected to a control terminal of the voltage-controlled switching device.

In the detection circuit, the constant voltage device is a device, such as Zener diode, which can block a current when a voltage on the side connected to the diode does not exceed a certain voltage. The fusing circuit has a fuse as a fusing device, which is not blown by the current when the voltage on the side connected to the diode does not exceed a blocking voltage of the constant voltage device. Meanwhile, when the voltage on the side connected to the diode exceeds the blocking voltage of the constant voltage device, the current begins passing through the fusing device. Once the current exceeds a rated current, i.e., fusible current of the fusing device in the fusing circuit, the fusing device is blown.

In the present invention, the control terminal of the voltage-controlled switching device is connected to the interconnection between the constant voltage device and the fusing circuit in the detection circuit. In a conductive state of the fusing device, this voltage-controlled switching device is tuned off while all the diodes residing in the corresponding group normally operate.

Meanwhile, once the fusing device is blown, the detection circuit causes a change of the voltage on the control terminal, so that the voltage-controlled switching device is tuned on to allow the current to flow from the input side to the output side of the corresponding group. Thus, if any diode is broken down into an open state, the voltage on the input side of the corresponding group rises up, and then the detection circuit blows the fusing circuit, and then the voltage-controlled switching device can bypass the current off the diodes residing in the corresponding group to continue the current supply for the diodes residing in both the upstream and downstream groups.

For the first voltage-controlled switching device, a transistor, specifically an FET (field effect transistor) can be used. In case of the FET, the drain and the source are connected to the anode and the cathode of the group, respectively. In case the detection circuit is composed of a Zener diode and a fuse for the fusing device, the fuse is connected between the gate and the source of the FET. The FET could be, for example, a MOS-type FET.

More specifically, the gate of the MOS-FET is connected via an appropriate resistor to another direct-current power source. Normally, in a conductive state of the fusing circuit, the gate voltage is approximately equal to the source voltage by means of the fuse. Once the fuse is blown by open breakage of the diode as described above, the gate is supplied with a voltage close to the drain voltage, causing the MOS-FET to be turned on for maintaining the bypass current.

Secondly, in a redundancy circuit for short-circuit breakage of diodes connected in series, each of the bypass circuit further has a second voltage-controlled switching device connected in parallel to the fusing circuit via a separate power source, and a control terminal of the second voltage-controlled switching device is connected to the interconnection between the detection circuit and the corresponding group.

When the internal resistance of any diode is decreased with a voltage drop of the corresponding group, the second voltage-controlled switching device is turned on by the control terminal to blow the fusing circuit, so that the current, which is to pass through the corresponding group, takes a detour of the first voltage-controlled switching device off the diodes residing in the corresponding group, thereby substantially cutting off the current in the corresponding group.

For the second voltage-controlled switching device, for example, a transistor can be used. The collector and the emitter are connected via the second power source between the two poles of the fusing circuit, respectively, and the base is connected to either the input side or the output side of the corresponding group so that the transistor can be turned on by a decreased voltage between the input side and the output side.

If any diode is short-circuited with a decreased voltage between the both sides of the corresponding group, the transistor is turned on to blow the fusing device in the fusing circuit using the current supplied from the second power source. Subsequently, the first voltage-controlled switching device, such as FET, is turned on as described above, so that the current, which is to pass through the corresponding group, takes a detour of the first voltage-controlled switching device.

In this embodiment, the fuse and an overcurrent protection resistor are preferably connected in series in the fusing circuit to prevent the redundancy circuit from malfunctioning.

The redundancy circuit according to the present invention, preferably has an indicator function for indicating the group of diodes under an open-circuit or short-circuit breakage.

In each bypass circuit, a primary circuit of a relay may be connected between the separate power source and the control terminal of the first voltage-controlled switching device, and a secondary circuit of the relay may be connected to an indicator device, so that the indicator device can be turned on when the fusing circuit is blown. Otherwise, in each bypass circuit, a light emitting device may be connected in parallel to the fusing circuit, so that the light emitting device can be turned on when the fusing circuit is blown.

Furthermore, in each bypass circuit, a primary circuit of a relay may be connected to the fusing circuit, and a secondary circuit of the relay may be connected to an indicator device, so that the indicator device can be turned on when the fusing circuit is blown.

For the relay mentioned above, a contact relay or a photo-coupler can be used. For the indicator device mentioned above, a light emitting diode or other display device can be used.

Embodiment 1

In a redundancy circuit according to each embodiment, a diode circuit which is composed of two diodes D0 connected in series will be exemplified hereinafter for simplicity, in which one group of diodes has only one diode, and each of bypass circuits A1 and A2 is connected in parallel to each of the diodes D0.

Figure 1:
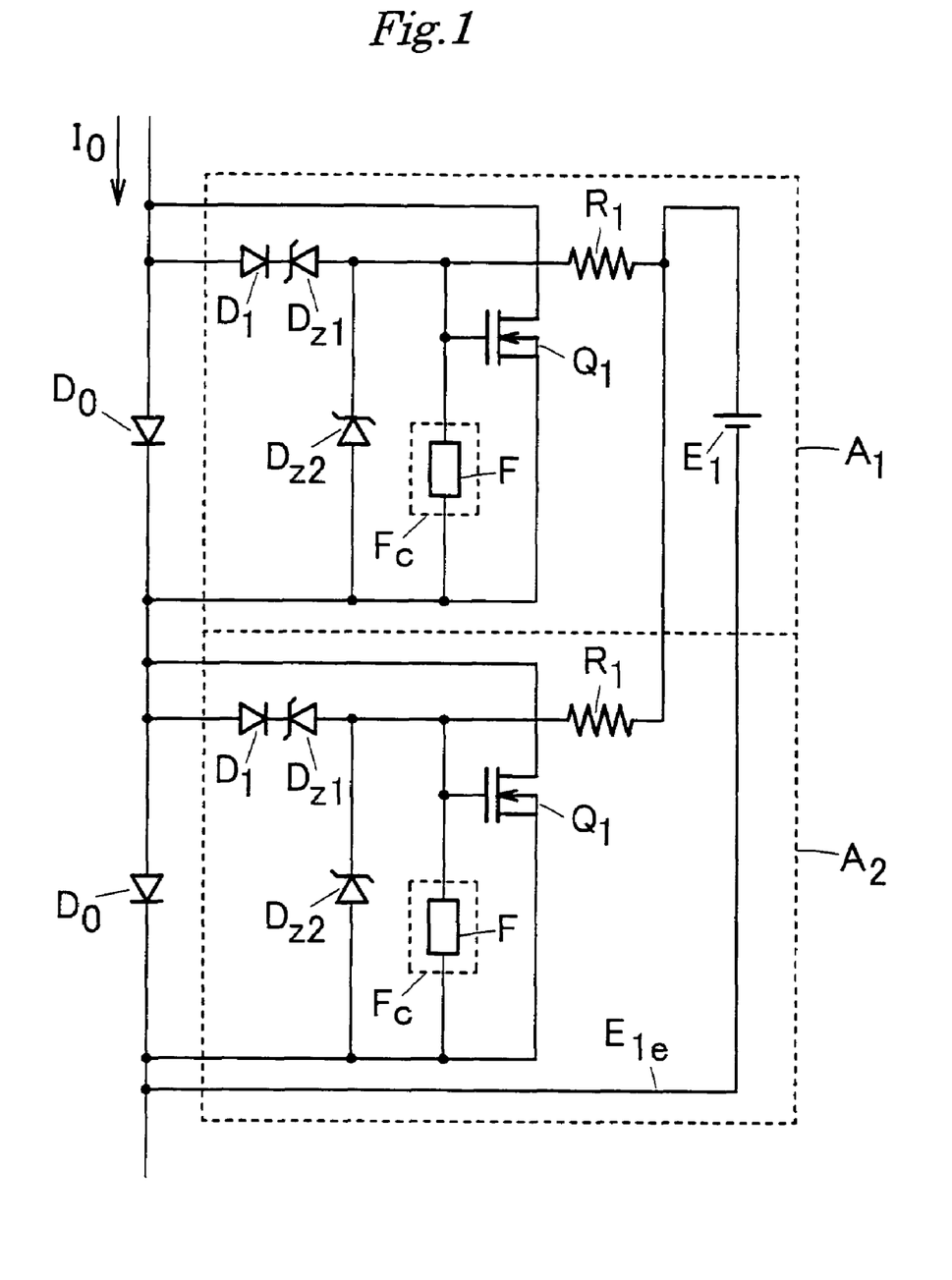
FIG. 1 illustrates a redundancy circuit for series-connected diodes circuit, according to an embodiment of the present invention.

In the redundancy circuit shown in FIG. 1, each of bypass circuits A1 and A2 includes a voltage-controlled switching device and a detection circuit, which are connected in parallel to each of the diodes D0. In this embodiment, for the voltage-controlled switching device used is a MOS-FET Q1, which is connected to the diode D0, and the detection circuit, which is connected in parallel to the diode D0, includes a Zener diode Dz1 for a constant voltage device and a fuse F for a fusing circuit Fc, which are connected in series. Between the diode D0 and the Zener diode Dz1, a diode D1 for reverse-blocking is connected in series. The gate of the MOS-FET is connected to the interconnection between the fuse F and the Zener diode Dz1. The source of the MOS-FET is connected to the opposite side of the fuse F, as equipotential to the gate. A second Zener diode Dz2 is connected in parallel to the fuse F.

Further, a direct-current power source E1 is connected via a resistor R1 to each gate of the FETs Q1, and the negative pole of the power source E1 is connected to a cathode of the diode D0 residing in a final group of a series of diodes.

The operation of the bypass circuit will be describe below. When all the series-connected diodes D0 operate normally under a normal current, a voltage drop of each diode remains small. Since the total of a Zener voltage of the Zener diode Dz1 and a forward voltage of the diode D1 is designed greater than the voltage drop, the Zener diode Dz1 blocks a current and the fuse F is not blown, so that the gate of the FET Q1 is kept equipotential to the source by the fuse F and the FET Q1 is turned off. Therefore, the bypass circuit does not work.

Meanwhile, in the bypass circuit A1 shown in FIG. 1, for example, if the diode D0 is broken down with a higher internal resistance, that is, open-circuit, the anode voltage of the diode D0 rises up relatively to the cathode voltage thereof. When the anode voltage exceeds the total of the Zener voltage of the Zener diode Dz1 and the forward voltage of the series-connected diode D1, a current flows from the anode of the diode D0 through the Zener diode Dz1 to blow the fuse F. After the fuse F is blown, a voltage of the power source E1 is applied via the resistor R1 to the gate of the FET, so that the FET is turned on. The current can flow from the anode of the diode D0 through the FET Q1 into the cathode of the diode D0, thereby supplying the subsequent diode D0 with the current. Thus, the bypass circuit A1 can bypass the current on behalf of the open-broken diode to maintain the operation of the series-connected diodes. After the fuse F is blown, the gate voltage of the FET is defined by the second Zener diode Dz2.

Once the fuse F is blown, even though the resistance of the diode D0 is reduced due to some factor, the voltage of the power source E1 is blocked by the reverse-blocking diode D1, so that the voltage between the gate and the source of the FET is kept higher than the threshold by the power source E1 and the second Zener diode Dz2. Therefore, the FET can continuously operate.

More specifically, since the FET used in this embodiment is a voltage-controlled type of current amplifier switch, the diode cannot attain full conduction unless the voltage between the gate and the source of the FET is sufficiently higher. The voltage of the power source E1 is set higher than the total of the threshold value Vth between the gate and the source of the FET and the source voltage Eqs of the FET.

The fuse F has an internal resistance, which may cause a voltage drop by a current passing through the reverse-blocking diode D1 and the Zener diode Dz1. Before the fuse is blown, a certain voltage exceeding the threshold value Vth between the gate and the source of the FET may be applied to the gate, the diode D0, the diode D1 and the Zener diode Dz1, thereby allowing a current to flow in the FET. This state may cause thermal loss in the FET if the FET keeps incomplete conduction. In order to prevent this phenomenon, the above-mentioned threshold value Vth of the FET is set greater than the product of the rated current and the internal resistance of the fuse F. This setting can prevent the loss because no current flows through the FET before the fuse F is blown, and after the fuse F is blown, the thermal loss does not substantially occur even though the bypass current flows through the FET because the FET keeps full conduction.

Embodiment 2

Figure 2:
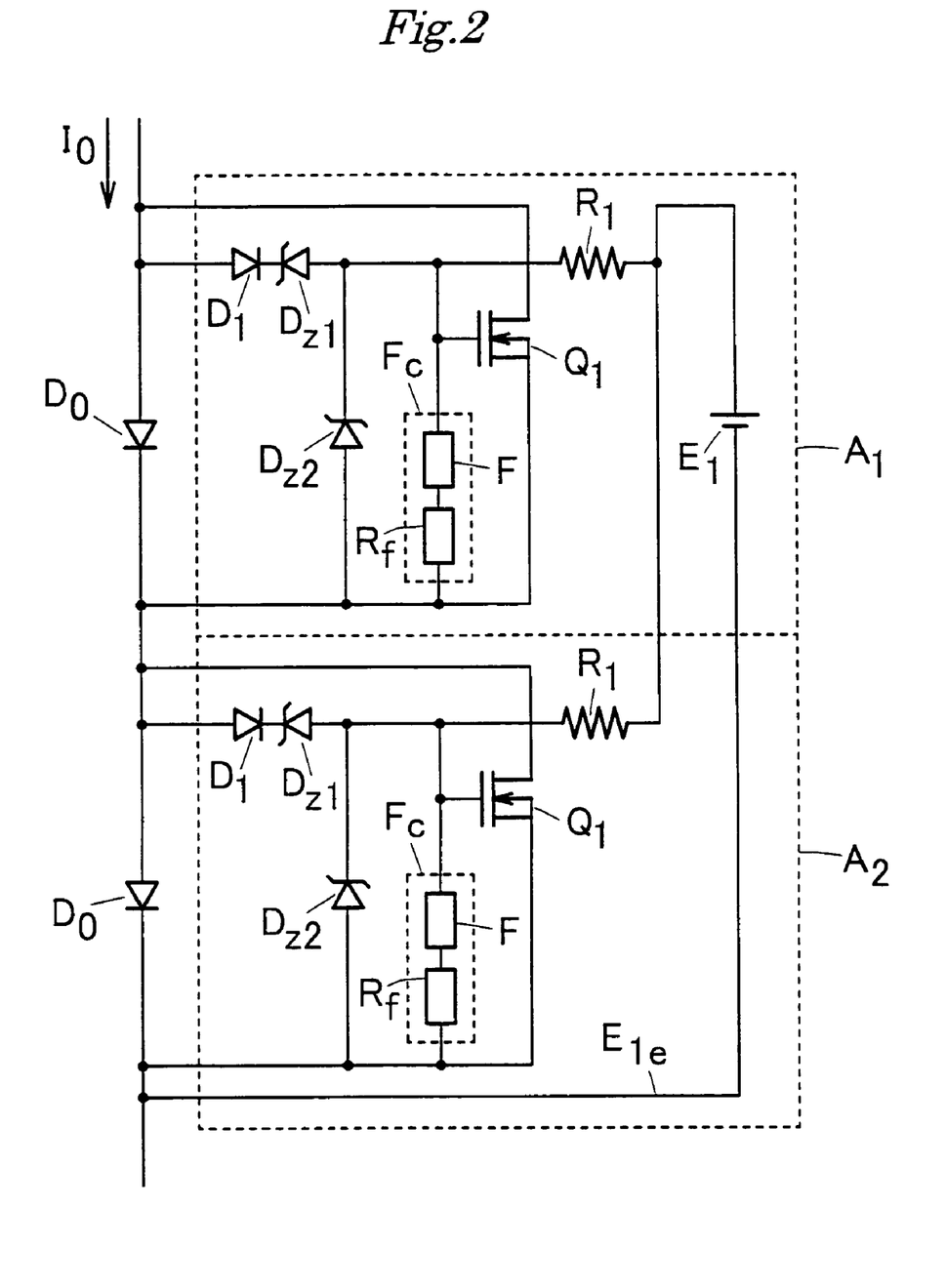
FIG. 2 illustrates a redundancy circuit for series-connected diodes circuit, according to another embodiment of the present invention.

In this embodiment, as shown in FIG. 2, the fusing circuit Fc is composed of the fuse F and a resistor Rf for protecting overcurrent, which are connected in series. In the fusing circuit Fc, similarly to the above-mentioned embodiment 1, since the reverse-blocking diode D1 and the Zener diode Dz1 are connected in series, if open breakage of the diode D0 causes an abrupt current, the resistor Rf can prevent the overcurrent to flow through the reverse-blocking diode D1 and the Zener diode Dz1. This overcurrent protection resistor Rf is set such that the product of the sum of the resistance Rf and the internal resistance of the fuse F, and the rated current of the fuse F is lower than the threshold value, thereby preventing a current from flowing in the FET before the fuse F is blown, and preventing the overcurrent from flowing through the reverse-blocking diode D1 and the Zener diode Dz1.

Embodiment 3

Figure 3:
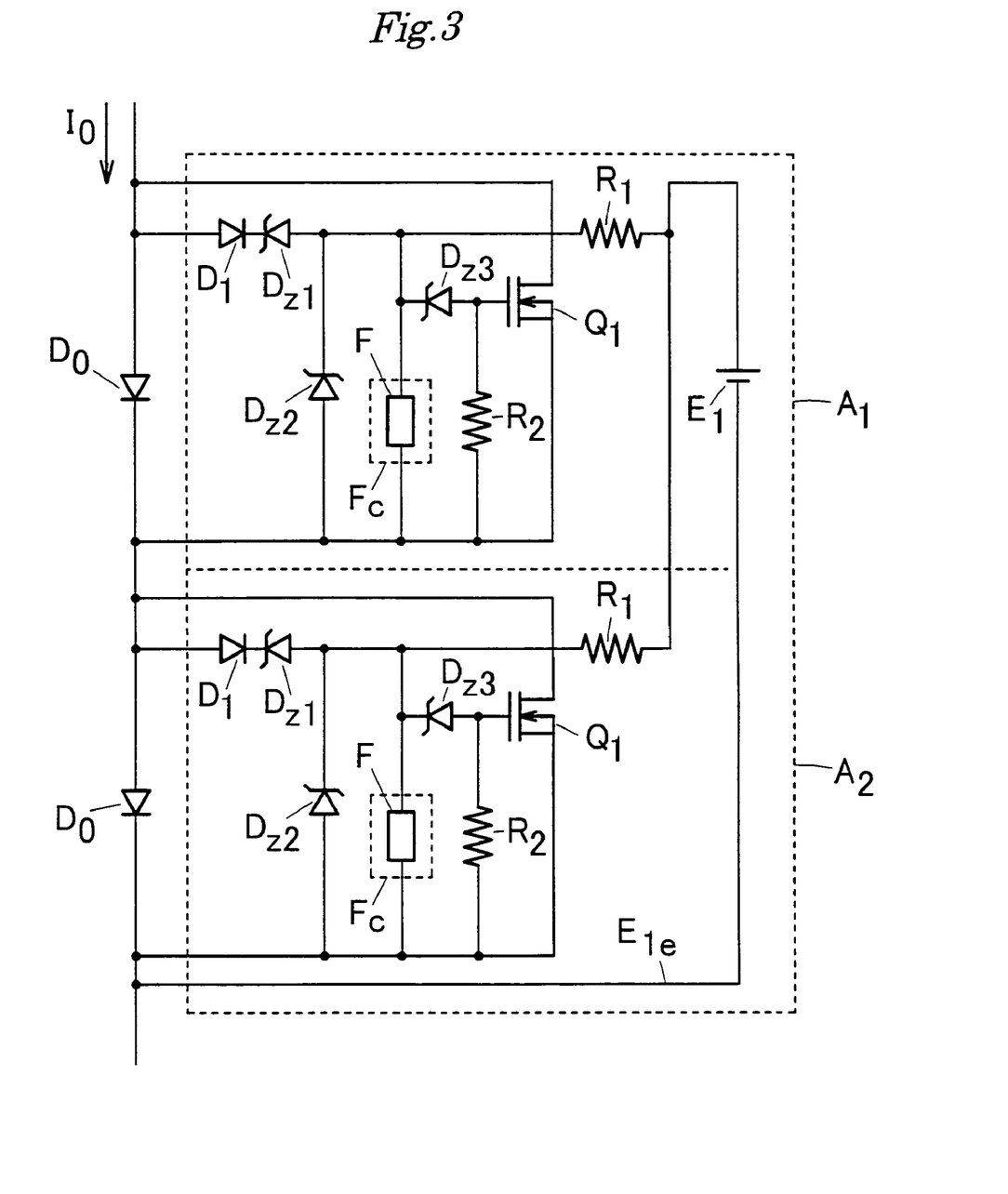
FIG. 3 illustrates a redundancy circuit for series-connected diodes circuit, according to yet another embodiment of the present invention.
Figure 4:
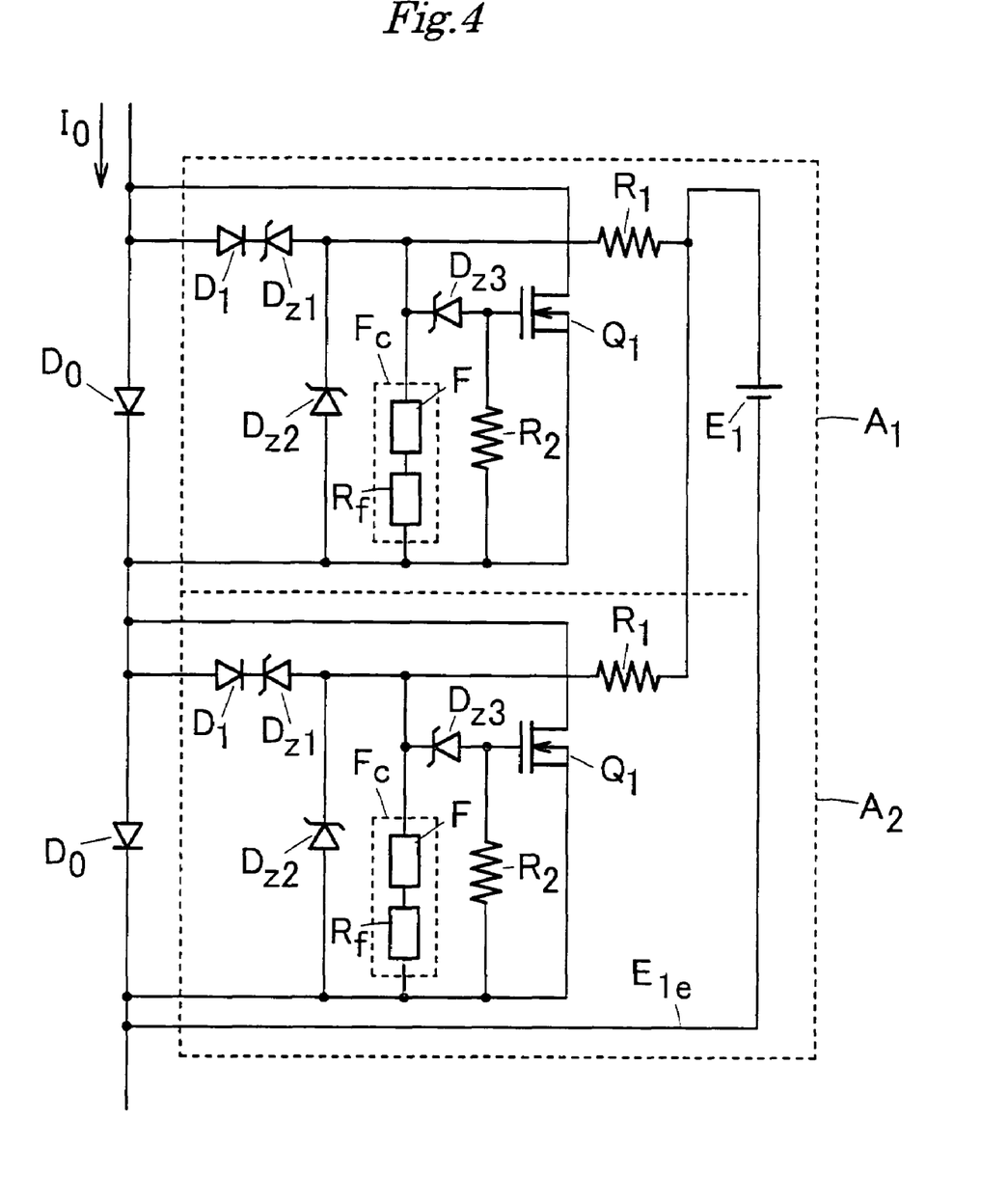
FIG. 4 illustrates a redundancy circuit for series-connected diodes circuit, according to still yet another embodiment of the present invention.

In the above-mentioned embodiments 1 and 2, as shown in FIGS. 1 and 2, it may be difficult for the threshold value Vth of the MOS-FET to be set greater than a value define by the product of the rated current and the internal resistance (or the internal resistance plus a series resistance) of the fuse F. As shown in FIGS. 3 and 4, a Zener diode Dz3 is connected in series to the gate of the FET, enhancing an operable voltage level. The operable voltage of the MOS-FET is defined by the sum of the Zener voltage $V_{Dz3}$ and the threshold value Vth of the Zener diode Dz3, therefore the operable voltage can be optionally set by choice of the Zener diode Dz3. This design can prevent a current from flowing in the FET before the fuse F is blown, thereby suppressing the loss of the FET.

In this case, since the input impedance of the MOS-FET is high, the gate voltage tends to rise up even in a normal operation state due to a leakage current $Il_{Dz3}$ of the Zener diode Dz3. If the gate voltage defined by the product of the leakage current of the Zener diode Dz3 and the input impedance of the MOS-FET exceeds the threshold voltage, the MOS-FET is turned on, resulting in malfunction of the bypass circuit A1. To cope with this problem, as shown in FIGS. 3 and 4, a resistor R2 is preferably connected between the gate and the source, thereby reducing the input impedance of the gate. The resistance R2 is set such that the product of the leakage current $Il_{Dz3}$ of the Zener diode Dz3 and the resistance R2 is lower than the threshold voltage Vth of the MOS-FET Q1.

In the case, as shown in FIGS. 3 and 4, the Zener diode Dz3 and the resistor R2 are connected to the gate of the MOS-FET Q1, after the fuse F is blown, the gate voltage Eg of the MOS-FET is defined by dividing using two resistors R1 and R2, a voltage which is defined by subtracting the source voltage Eqs of the MOS-FET and the Zener voltage $V_{Dz3}$ of the Zener diode Dz3 from the voltage of the power source E1 as follows:

$$Eg=(E1-Eqs-V_{Dz3})\times R2/(R1+R2)$$

Thus, the resistance R2 interposed between the gate and the source is preferably smaller to prevent the rise of the gate voltage due to the leakage current of the Zener diode Dz3. On the other hand, the resistance R1 residing on the side of the power source E1 is set preferably greater so as to save capacity of the power source and not to affect speed of response of a turn-on switching circuit of the MOS-FET. Practically, setting of increasing the resistance R1 and decreasing the resistance R2 may reduce the gate voltage Eg of the MOS-FET, thereby disabling the MOS-FET to be turned on. Therefore, the voltage of the power source E1 and two resistances R1 and R2 are preferably set with such trade-off as the above-mentioned relation.

Embodiment 4

In this embodiment, the redundancy circuit shown in FIG. 1 includes a means for detecting a broken diode, in which the primary circuit of a photo-coupler Pc as a relay circuit is connected on the way from the power source E1 via the resistor R1 to the gate of the FET, and the secondary circuit of the photo-coupler Pc is connected to an indicator device.

Figure 5:
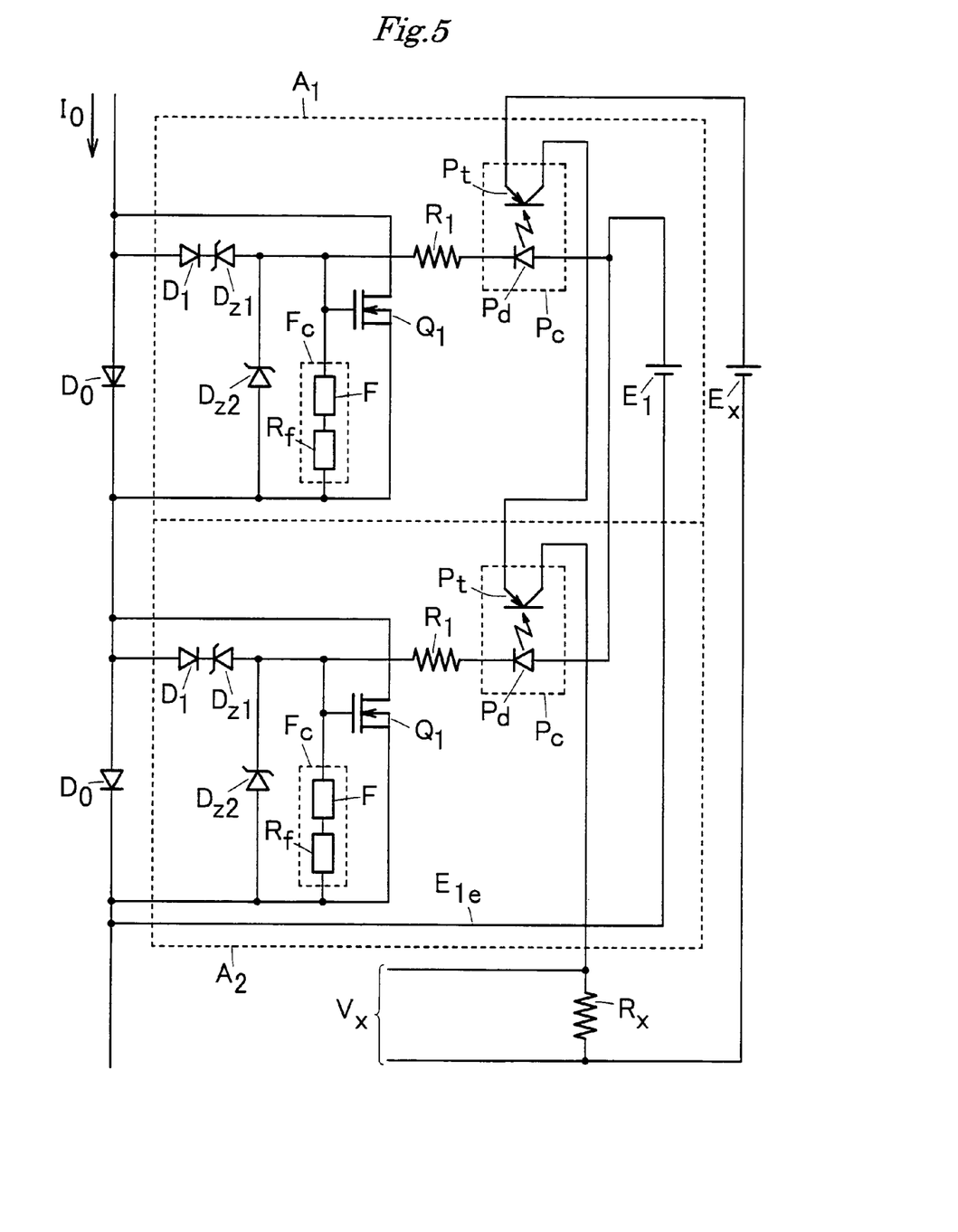
FIG. 5 illustrates a redundancy circuit for series-connected diodes circuit, according to still yet another embodiment of the present invention.

In FIG. 5. a light emitting diode Pd of the primary circuit of the photo-coupler Pc is connected in series between the direct-current power source E1 and the resistor R1 in each of the bypass circuits A1 and A2. Photo-transistors Pt of the secondary circuits of the photo-couplers Pc are connected in series to each other, to which a second direct-current power source E2 is connected via a load resistor Rx which outputs a voltage Vx on output terminals.

Since the photo-coupler Pc is provided in each of the bypass circuits A1 and A2, when the diode D0 operates normally, a current flows from the power source E1 through the primary light emitting diode of the photo-coupler Pc via the fuse f, enabling the secondary photo-transistor to be turned on. Therefore, during normal operation of all the series-connected diodes D0, a current flows from the power source Ex through all the series-connected secondary photo-transistors, causing the voltage Vx on the load resistor Rx.

Meanwhile, when anyone of the diodes D0 is broken into an open state, as described in embodiment 1, the fuse F is blown to shut off the current from the direct-current power source E1, so that the load resistor Rx does-not output any voltage. Therefore, by monitoring a change of the output voltage, it can be judged whether the diode is broken down.

Embodiment 5

Figure 6A:
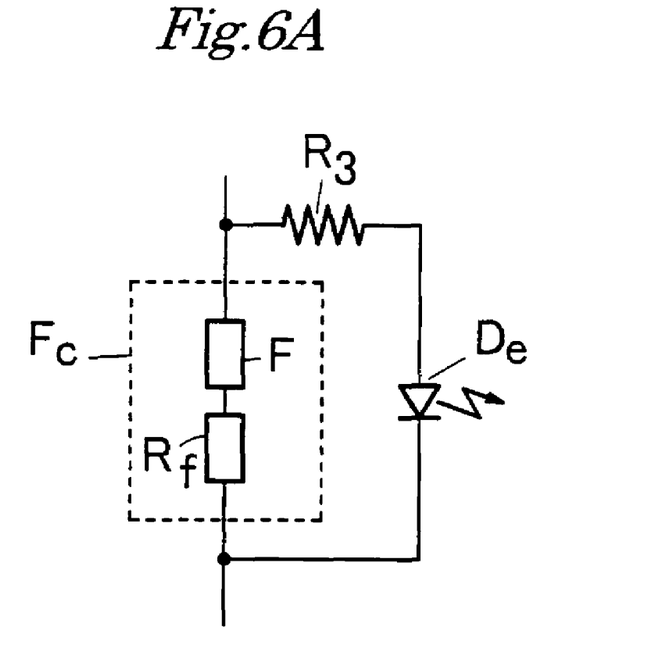
FIGS. 6A and 6B illustrate a light emitting device and a photo-coupler, respectively, in the redundancy circuit for series-connected diodes circuit, according to the embodiment of the present invention.

In this embodiment, the above-mentioned fusing circuit Fc, which is composed of the fuse F and the resistor Rf connected in series, is connected in parallel to a light emitting diode De and an appropriate resistor R3, both of which are connected in series. Open breakage of the diode D0 directly enables the light emitting diode De to emit light for easy detection and identification of the broken diode D0. FIG. 6A illustrates an example of a circuit in which the light emitting diode De is connected via the resistor R3 in parallel to the fusing circuit Fc used in the redundancy circuit as shown in FIGS. 1 to 5. The fusing circuit Fc and the light emitting diode De with the series-connected resistor R3 are connected in parallel between the gate and the source of the FET Q1. When the diode D0 is broken into an open state, the fuse F is blown, and then a high voltage exceeding the threshold value of the FET is applied from the first power source to the gate of the FET, and then the FET Q1 is turned on, while this high voltage directly enables the light emitting diode De to emit light, thereby detecting the broken diode D0.

Figure 6B:
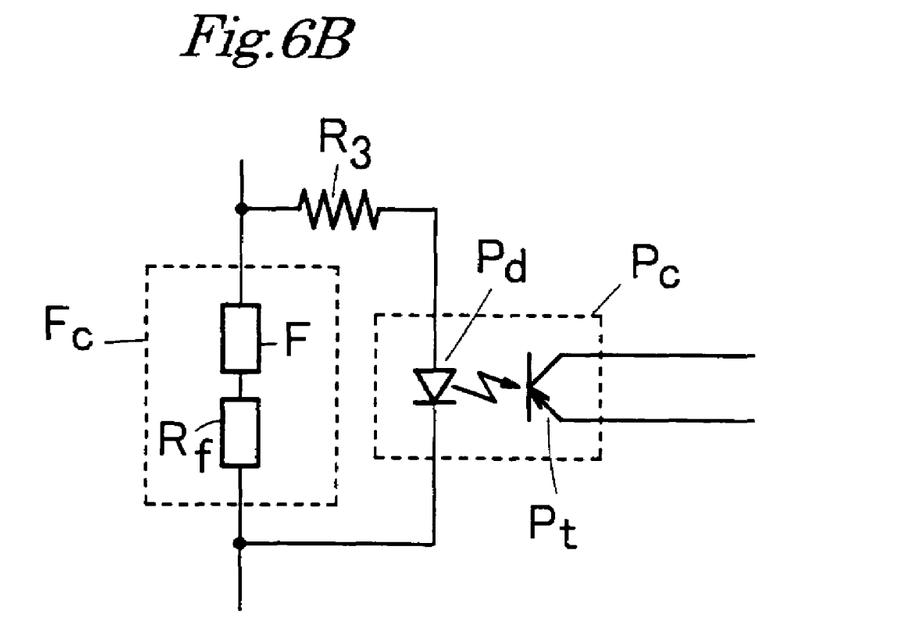

FIG. 6B illustrates another example of a circuit in which the primary light emitting diode Pd of a photo-coupler Pc, alternatively to the light emitting diode De in FIG. 6A, may be connected via a similar resistor R3 in parallel to the fusing circuit Fc (or between the gate and the source of the FET). The secondary photo-transistor Pt of the photo-coupler Pc may be connected to an indicator or other monitoring circuits (not shown), thereby detecting the broken diode D0 through the monitoring circuits.

Embodiment 6

In this embodiment, another redundancy circuit will be described below, which can exert redundancy when the diode D0 is short-circuited with the internal resistance thereof lowered. The circuit shown in the embodiment 1 is provided with bypass auxiliary circuits B1 and B2 described below, corresponding to the above-mentioned bypass circuits A1 and A2.

Figure 7:
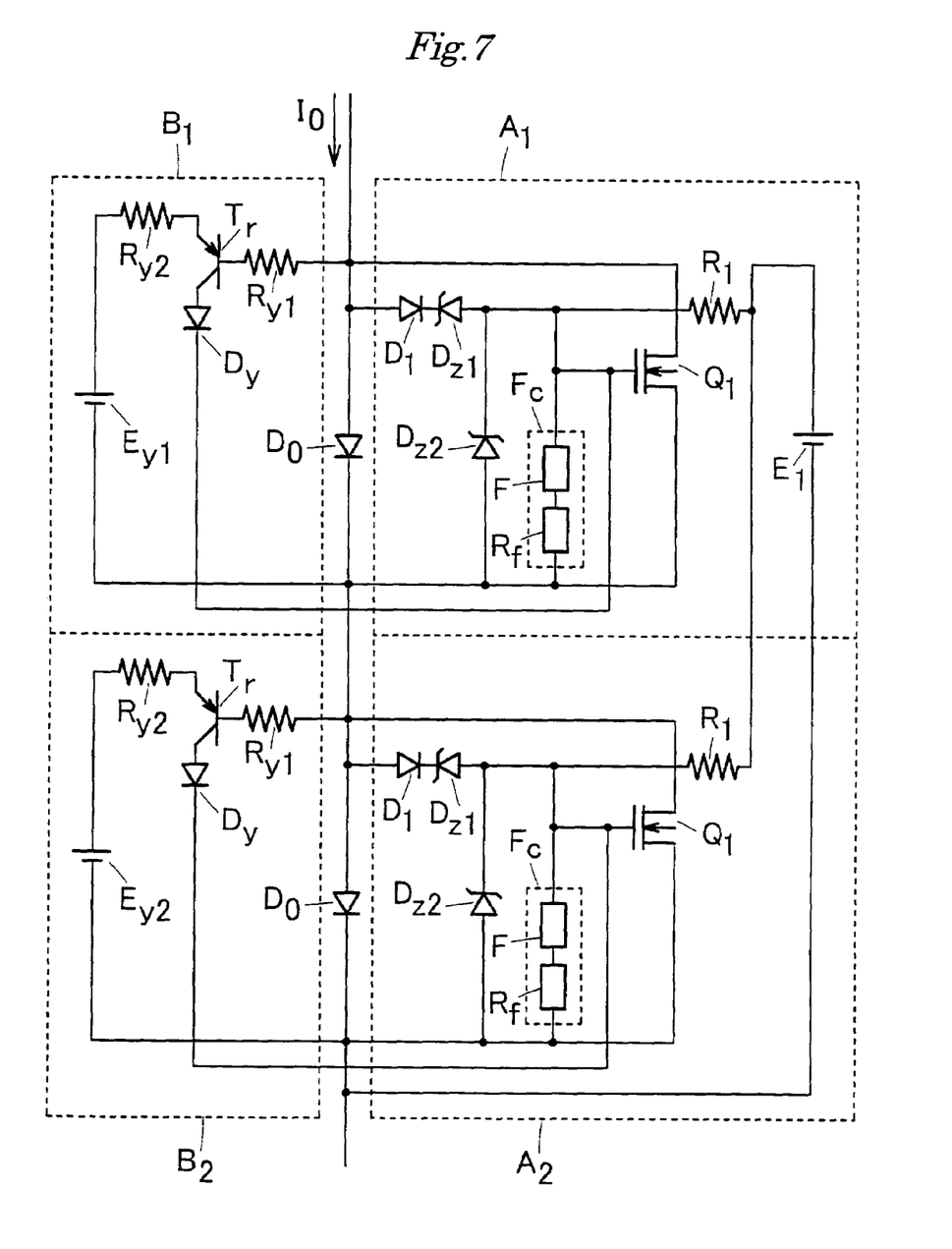
FIG. 7 illustrates a redundancy circuit for series-connected diodes circuit, according to still yet another embodiment of the present invention.

In each of the bypass auxiliary circuits B1 and B2, as shown in FIG. 7, the base of a PNP-transistor Tr, as a second voltage-controlled switching device, is connected via a resistor Ry1 to the anode of the diode D0. The emitter thereof is connected via another power source Ey1 to the cathode of the diode D0. The collector thereof is connected via a reverse-blocking diode Dy to the gate of the above-mentioned FET Q1.

If the diode D0 is short-circuited with the internal resistance lowered during use, the voltage drop between the anode and the cathode of the diode D0 is decreased. When the voltage between the base and collector of the transistor Tr is also decreased below a given value, a current flows from the power source Ey through the transistor Tr and the fuse f, which is blown by a rated or more current, and then a voltage from the direct-constant power source E1 is applied to the gate of the FET, which is turned on. Accordingly, no current passes through the diode D0 and the other series-connected diodes D0 are supplied with a bypass current passing through the FET.

In this embodiment, once the fuse F is blown due to the reduced resistance of the diode D0, a voltage equal to or higher than the threshold value is applied from the power source E1 between the gate and the source of the FET, so that the bypass current continues to flow thorough the FET even though the resistance of the diode D0 is increased later. Therefore, the diode D0 is no longer reused.

The redundancy circuit for series-connected diodes according to the present invention, can be widely applied to fields of semiconductor manufacturing and image displaying, as a protect circuit for a display apparatus in which a number of diodes, in particular light emitting diodes or laser diodes are arranged in array.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A redundancy circuit for a diode circuit composed of a plurality of diodes connected in series, comprising:
    bypass circuits, each of which is connected in parallel to each group, the diode circuit being divided into a plurality of group, each group having one or more diodes connected in series,
    each bypass circuit including a first voltage-controlled switching device connected in parallel to the corresponding group, and a detection circuit which has a constant voltage device and a fusing circuit, both of which are connected in series, the detection circuit being connected in parallel to the corresponding group;
    wherein the interconnection between the constant voltage device and the fusing circuit is connected to a control terminal of the voltage-controlled switching device, and
    when, because of increased resistance of any diode, a voltage applied to one of the groups exceeds a given voltage defined by the constant voltage device, the voltage-controlled switching device is turned on by the control terminal so as to bypass a current that is to pass through the corresponding group.

2. The redundancy circuit according to claim 1, wherein the first voltage-controlled switching device is a field effect transistor, the control terminal of which is the gate thereof, to which a voltage is applied from a separate power source.

3. The redundancy circuit according to claim 1, wherein each of the bypass circuit further includes a second voltage-controlled switching device connected in parallel to the fusing circuit via a power source, and a control terminal of the second voltage-controlled switching device is connected to the interconnection between the detection circuit and the corresponding group, and
    when resistance of any diode is decreased, the second voltage-controlled switching device is turned on by the control terminal so as to blow the fusing circuit, so that the first voltage-controlled switching device bypasses a current that is to pass through the corresponding group.

4. The redundancy circuit according to claim 1, wherein the fusing circuit is composed of a fuse and an overcurrent protect resistor, both of which are connected in series to each other.

5. The redundancy circuit according to claim 2, wherein in each bypass circuit the primary circuit of a rely is connected between the separate power source and the control terminal of the voltage-controlled switching device, and the secondary circuit of the relay is connected to an indicator device, which is turned on when the fusing circuit is blown.

6. The redundancy circuit according to claim 1, wherein in each bypass circuit a light emitting device is connected in parallel to the fusing circuit so as to operate when the fusing circuit is blown.

7. The redundancy circuit according to claim 1, wherein in each bypass circuit the primary circuit of a rely is connected to the fusing circuit, and the secondary circuit of the relay is connected to an indicator device, which is turned on when the fusing circuit is blown.

8. The redundancy circuit according to claim 5, wherein the relay is a photo-coupler.

9. The redundancy circuit according to claim 7, wherein the relay is a photo-coupler.

* * * * *